(12) United States Patent
Asano

(10) Patent No.: US 7,790,521 B2
(45) Date of Patent: Sep. 7, 2010

(54) THIN FILM SEMICONDUCTOR DEVICE, METHOD OF MANUFACTURING THE SAME AND DISPLAY

(75) Inventor: Akihiko Asano, Knagawa (JP)

(73) Assignee: Sony Corporation, Tokyo (JP)

( * ) Notice: Subject to any disclaimer, the term of this patent is extended or adjusted under 35 U.S.C. 154(b) by 494 days.

(21) Appl. No.: 11/753,751

(22) Filed: May 25, 2007

(65) Prior Publication Data

US 2007/0290200 A1    Dec. 20, 2007

(30) Foreign Application Priority Data

Jun. 2, 2006    (JP)    ............................. 2006-154105

(51) Int. Cl.
*H01L 21/00*    (2006.01)
*H01L 21/84*    (2006.01)

(52) U.S. Cl. .................... 438/149; 438/48; 438/128; 438/151; 438/157; 438/283; 257/40; 257/59; 257/72

(58) Field of Classification Search ............. 257/59, 257/72; 438/48, 128, 149, 151, 157, 283
See application file for complete search history.

(56) References Cited

U.S. PATENT DOCUMENTS

2006/0079040 A1*   4/2006   Tanaka et al. ............... 438/166
2006/0186415 A1*   8/2006   Asano .......................... 257/72

FOREIGN PATENT DOCUMENTS

JP    2001-102589    4/2001
JP    2003-318108    11/2003

\* cited by examiner

*Primary Examiner*—Kenneth A Parker
*Assistant Examiner*—Anthony Ho
(74) *Attorney, Agent, or Firm*—Sonnenschein Nath & Rosenthal LLP

(57) ABSTRACT

A method of manufacturing a thin film semiconductor device is disclosed. The method includes the steps of: forming a light reflection and absorption layer for reflecting and absorbing light on a substrate; patterning the light reflection and absorption layer in a prescribed shape; forming an insulating film covering the patterned light reflection and absorption layer; forming a semiconductor thin film containing a polycrystalline grain on the insulating film; and laser annealing the semiconductor thin film by irradiating pulse oscillated laser light to crystallize the semiconductor thin film. The laser annealing step includes a heating process, and a cooling process.

9 Claims, 9 Drawing Sheets

THIN FILM SEMICONDUCTOR DEVICE, METHOD OF MANUFACTURING THE SAME AND DISPLAY

CROSS REFERENCES TO RELATED APPLICATIONS

The present invention contains subjects related to Japanese Patent Application JP 2006-154105 filed in the Japan Patent Office on Jun. 2, 2006, the entire contents of which being incorporated herein by reference.

BACKGROUND OF THE INVENTION

1. Field of the Invention

The invention relates to a thin film semiconductor device and a method of manufacturing the same and to a display of an active matrix type configured of a thin film semiconductor device. In more detail, the invention relates to a crystallization technology of a semiconductor thin film for forming a device region of a thin film semiconductor device. In further detail, the invention relates to a lateral crystal growth technology for applying a temperature difference to different regions of a semiconductor thin film by laser annealing and inducing crystal growth in a planar direction (lateral direction) of the film by utilizing it.

2. Description of the Related Art

A thin film semiconductor device employs a thin film transistor as a major configuration device. The thin film transistor uses a semiconductor thin film as an active layer. As the semiconductor thin film, for example, a silicon film is generally used. In recent years, a technology for forming a polycrystalline silicon film on a cheap glass substrate to form an active layer of a thin film transistor is being developed.

As the technology for forming a polycrystalline silicon film on a glass substrate at a low temperature, a crystallization technology by irradiation with laser light is developed. The crystallization by irradiation with laser light (hereinafter sometimes referred to as "laser annealing") is a technology for absorbing energy of laser light onto an amorphous silicon film to instantaneously melt only the film and recrystallizing it in a cooling process.

Recently, a technology for obtaining a polycrystalline silicon film with high crystallinity by using continuous oscillation laser light is reported. This technology is a technology for scanning continuous oscillation laser light on an amorphous silicon film, moving a solid-liquid interface of a semiconductor thin film in a lateral direction to make a temperature difference in the film and causing lateral crystal growth in the silicon film by utilizing this temperature difference. However, in view of the point that if a scanning speed is low, the film itself causes bumping and disappears, whereas if the scanning speed is high, it exceeds the movement speed of the solid-liquid interface so that the lateral crystal growth becomes insufficient, this technology is narrow with respect to a process margin.

A lateral crystal growth technology utilizing pulse oscillation laser light instead the continuous oscillation laser light is developed and described in, for example, JP-A-2003-318108 (Patent Document 1). In this Patent Document 1, an amorphous silicon film is formed on a substrate, and a metal film is further formed on a part of the amorphous silicon film. By using this metal film as a mask, first irradiation with laser light is performed from an upper part of the amorphous silicon film, thereby crystallizing a portion other than the part of the amorphous silicon film masked by the metal film. Thereafter, the metal film is removed, and second irradiation with laser light is performed from an upper part of the amorphous silicon film, thereby crystallizing the part of the amorphous silicon film by means of lateral growth. A polycrystalline silicon film having been crystallized by the second irradiation with laser light is used in a channel region of a thin film transistor. Besides, a technology which is not a lateral crystal growth technology but a technology for crystallizing a silicon thin film by double irradiation with excimer laser light to convert it into a polycrystalline silicon film is described in JP-A-2001-102589 (Patent Document 2).

SUMMARY OF THE INVENTION

However, in the lateral crystallization technology disclosed in Patent Document 1, laser light is irradiated twice in total, during which time the crystallization is performed according to the following procedures of (formation of metal mask)→(first irradiation with laser)→(removal of metal mask)→(second irradiation with laser), and therefore, the process becomes complicates. Thus, this is not preferable in view of the productivity.

In view of the foregoing circumstances of the related art, it is desirable to form a polycrystalline semiconductor thin film with a uniform crystal structure on a gate pattern which is an active region of a thin film transistor by irradiating laser light capable of semi-transmitting through a semi-conductor thin film to selectively cause lateral crystal growth on the gate pattern.

According to an embodiment of the invention, there is provided a method of manufacturing a thin film semiconductor device including the steps of: forming a light reflection and absorption layer for reflecting and absorbing light on a substrate; patterning the light reflection and absorption layer in a prescribed shape; forming an insulating film covering the patterned light reflection and absorption layer; forming a semiconductor thin film containing a polycrystalline grain on the insulating film; and laser annealing the semiconductor thin film by irradiating pulse oscillated laser light to crystallize the semiconductor thin film, wherein the laser annealing step includes a heating process in which pulse heating with laser light is carried out such that in an external region of the semiconductor thin film located outside the pattern of the light reflection and absorption layer, its temperature is not higher than a melting point of the semiconductor thin film, whereas in an internal region of the semiconductor thin film located inside the pattern of the light reflection and absorption layer, the semiconductor thin film is melted; and a cooling process in which after the internal region has been melted, lateral growth proceeds inwardly from a boundary between the external region and the internal region while making a polycrystalline grain in the external region act as a nucleus, thereby forming a more expanded polycrystalline grain in at least a part of the internal region.

It is preferable that the semiconductor thin film formed in the semiconductor thin film forming step which is a preceding step of the laser annealing step is a polycrystalline thin film containing a polycrystalline grain of silicon or composed of silicon as a major component. In that case, in the semiconductor thin film forming step, after fabricating a semiconductor thin film of silicon or composed of silicon as a major component on a substrate by a vapor phase epitaxy method, laser light having a wavelength of an ultraviolet region is irradiated to convert it into a polycrystalline thin film. Alternatively, in the semiconductor thin film forming step, after fabricating a semiconductor thin film of silicon or composed of silicon as a major component on a substrate by a vapor phase epitaxy method, laser light having a wavelength of a visible light region is irradiated to convert it into a polycrystalline thin film. Alternatively, in the semiconductor thin film forming step, a polycrystalline thin film of silicon or composed of silicon as a major component can also be formed directly on a substrate by reactive heat CVD or plasma CVD.

When a semiconductor thin film of silicon or composed of silicon as a major component is taken as an example, in the laser annealing step, it is preferable that laser light capable of semi-transmitting through the semiconductor thin film and having a wavelength ranging from 520 nm to 540 nm is irradiated on a substrate. Also, in the laser annealing step, pulse oscillated laser light is irradiated on a substrate while scanning within a range where the irradiation region overlaps. Also, in the light reflection and absorption layer forming step, a light reflection and absorption layer is formed by using a conductive material; and in the patterning step, the conductive material is patterned to work it into a wiring containing a gate electrode. In that case, in the light reflection and absorption layer forming step, a high melting metal or an alloy or silicide containing a high melting metal as a component is used as the conductive material for forming a light reflection and absorption layer.

Furthermore, according to an embodiment of the invention, there is provided a thin film semiconductor device having: an insulating substrate; and a thin film transistor integrated and formed on the insulating substrate, wherein the thin film transistor is made of a gate electrode, a gate insulating film and a semiconductor thin film stacked in this order from the bottom; the semiconductor thin film has a channel region overlapping with the gate electrode and a source region and a drain region located on both sides of the channel region; the semiconductor thin film is a polycrystalline layer crystallized by laser annealing upon irradiation with laser light from the top of the substrate and is separated into an internal region and an external region along a boundary of a prescribed pattern, the internal region having a lateral growth region containing a polycrystalline grain laterally grown inwardly from a boundary between the external region and the internal region while making a polycrystalline grain located at the boundary act as a nucleus; and the channel region is formed in the lateral growth region.

It is preferable that the semiconductor thin film is a polycrystalline layer resulting from crystallization by laser annealing for irradiating laser light via a light reflection and absorption layer of a prescribed pattern and is formed via a process in which the internal region located inside the pattern of the light reflection and absorption layer is selectively melted, the melted semiconductor thin film is cooled, and lateral growth proceeds inwardly from a boundary between the external region and the internal region while making a part of a polycrystalline grain of the external region act as a nucleus, thereby forming a more expanded polycrystalline grain in the internal region. Also, the light reflection and absorption layer used in the laser annealing step is made of a conductive material, and the gate electrode is formed of the conductive material as it is or after working it. Also, in the gate electrode, a high melting metal or an alloy or silicide containing a high melting metal as a component is used as the conductive material. Also, the thin film transistor may be provided with an LDD region having an impurities concentration lower than the drain region between the channel region and at least the drain region.

In addition thereto, according to an embodiment of the invention, there is provided a display having: an insulating substrate; a pixel; and a thin film transistor for driving the pixel, the pixel and thin film transistor being integrated and formed on the insulating substrate, wherein at least a part of the thin film transistor is a thin film transistor manufactured by the foregoing laser annealing step.

It is preferable that the pixel is made of an organoelectroluminescence device. Alternatively, the pixel is made of a pixel electrode connected to the thin film transistor, a counter electrode opposing thereto and a liquid crystal held therebetween.

According to an embodiment of the invention, because of two effects that the semiconductor thin film overlapping on the light reflection and absorption layer is irradiated at a high laser light intensity corresponding to the surface reflection of the light reflection and absorption layer as compared with a portion not overlapping with the light reflection and absorption layer (a portion existing directly on a glass substrate); and that after the light reflection and absorption layer has been heated directly by laser light absorbed on the light reflection and absorption layer without being reflected on the light reflection and absorption layer, the heat is conducted to the semiconductor thin film, thereby heating it, the matter that the internal region of the semiconductor thin film existing inside the light reflection and absorption layer pattern is selectively melted without melting the external region of the semiconductor thin film existing outside the light reflection and absorption layer pattern, namely while keeping the polycrystalline state, thereby achieving lateral growth is utilized. Incidentally, though the present laser annealing step can be basically achieved by one-time irradiation with laser light, the irradiation may be performed several times, if desired.

In the case where the semiconductor thin film is made of silicon or composed of silicon as a major component, since the portion overlapping with the light reflection and absorption layer is selectively melted upon irradiation with laser light and excessive heat energy is not applied to the semiconductor thin film of the external region, it is effective to use laser light having a wavelength ranging from 520 nm to 540 nm. This laser light of a green wavelength is named as a so-called green laser and is characterized in that a light absorptivity of the silicon film is low as compared with an ultraviolet excimer laser. For example, in the case where a thickness of the silicon thin film is not more than 100 nm, the green laser is absorbed only in a proportion of from approximately 5 to 10% by the silicon film. Accordingly, it becomes possible to heat the silicon thin film of the portion overlapping with the light reflection and absorption layer in a high energy density corresponding to reflection by the light reflection and absorption layer and re-incidence on the silicon thin film as compared with other portion. By using this green laser, it becomes possible to selectively melt the internal region of the semiconductor thin film existing inside the gate electrode and subsequently induce lateral crystal growth.

FIG. 9 is a model diagram to schematically express a reflection and absorption state of a green laser light pulse and a heat flow. This model schematically expresses reflection and absorption processes (1) to (5) appearing when a light reflection and absorption layer made of metallic Mo, an insulating film made of $SiO_2$ and a semiconductor thin film made of Si are formed on a glass substrate in this order from the bottom, and a green laser light pulse is irradiated thereon. (1) A green laser light is first made incident on the Si layer. (2) About 35% of the green light made incident on the Si layer is reflected on the surface. (3) The remaining green light is reflected on an $Mo/SiO_2$ interface, passed through the $SiO_2$ layer and then made incident again on the Si layer. (4) On that occasion, absorption of the green light on the $SiO_2$ layer is negligible. This is because the film thickness is thin, and the green light is transparent in a visible region. (5) A portion which is not reflected on the $Mo/SiO_2$ interface is absorbed on the Mo layer, thereby directly heating the Mo layer. A part of the generated heat is conducted to the Si layer via the $SiO_2$ layer in a time region where a width of the laser pulse is at least in an initial stage, thereby heating it. According to the present annealing step, because of two effects that the semiconductor thin film is irradiated at a high laser light intensity corresponding to the surface reflection of the light reflection and absorption layer; and that after heating the light reflection and absorption layer has been heated directly by laser light absorbed on the light reflection and absorption layer without being reflected on the surface of the light reflection and absorption layer, the heat is conducted to the semiconductor thin film, thereby heating the internal region, the internal region of the semiconductor thin film existing inside the light reflection and absorption layer pattern can be selectively melted without melting the external region of the semiconductor thin film existing outside the light reflection and absorption layer pattern.

In accordance with the manufacturing method according to an embodiment of the invention, the lateral crystal growth is controlled pursuant to the pattern of the light reflection and absorption layer to be formed prior to the laser annealing. According to this, it becomes possible to control the size and direction of a polycrystalline silicon grain boundary in the internal region, and electric characteristics and uniformity thereof are remarkably improved. By using this internal region in the channel region of a thin film transistor, it is possible to remarkably improve the characteristics of the thin film transistor.

Furthermore, even in the case where the irradiation region partially overlaps, since the size and location of the crystal grain do not substantially change, it is also possible to irradiate the substrate with pulse oscillated laser light while scanning a range where the irradiation region partially overlaps. For example, even when a line beam whose irradiation region has a longitudinal shape is irradiated overlapping in a major axis direction, the crystallinity does not substantially change. Accordingly, by irradiating a line beam while partially overlapping, it is possible to uniformly crystallize a device with a width exceeding a width of the line beam.

DETAILED DESCRIPTION OF THE PREFERRED EMBODIMENTS

Figure 1A:
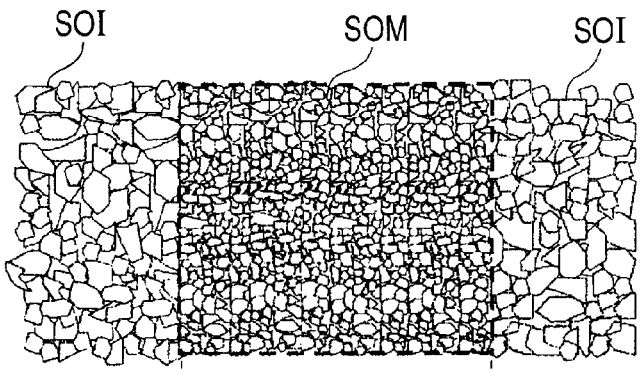
FIGS. 1A to 1C are each a schematic view to show a basic configuration of a manufacturing method of a thin film semiconductor device according to an embodiment of the invention.
Figure 1B:
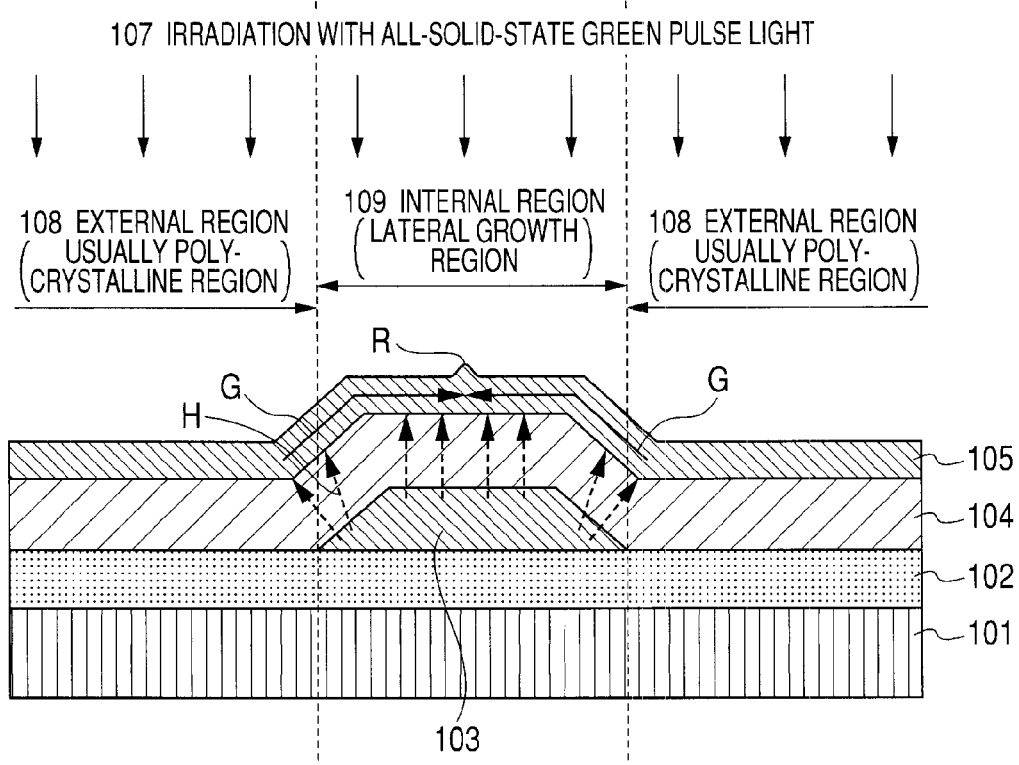
Figure 1C:
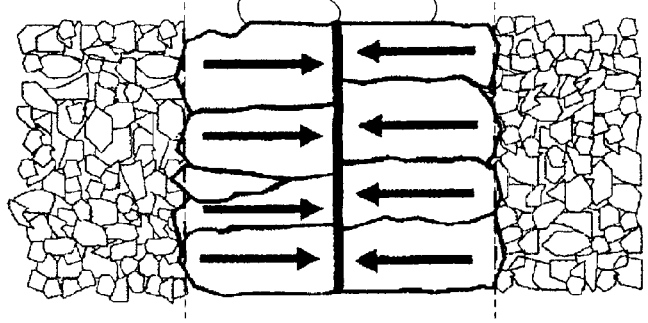

Embodiments of the invention are hereunder described in detail with reference to the accompanying drawings. FIGS. 1A to 1C are each a schematic view to show a principal part of a manufacturing method of a thin film semiconductor device according to an embodiment of the invention. FIG. 1B shows a schematic cross-sectional view of a semiconductor device; and FIGS. 1A and 1C are each a plan view so show a phase change of a semiconductor thin film appearing in a manufacturing process. Basically, a manufacturing method of a thin film semiconductor device according to an embodiment of the invention includes a light reflection and absorption layer forming step, a patterning step, an insulating film forming step, a semiconductor thin film forming step, and a laser annealing step. As illustrated in FIG. 1B, first of all, in the light reflection and absorption layer forming step, a light reflection and absorption layer 103 is formed on a transparent substrate 101 made of a glass or the like. In the present embodiment, a heat buffer layer 102 is formed in advance on a surface side of the substrate 101, and the light reflection and absorption layer 103 is formed thereon. Subsequently, in the patterning step, the light reflection and absorption layer 103 is patterned in a prescribed shape by etching. In the next insulating film forming step, the patterned light reflection and absorption layer 103 is covered by an insulating film 104. Furthermore, in the semiconductor thin film forming step, a semiconductor thin film 105 is formed on this insulating film 104. This semiconductor thin film 105 is, for example, an amorphous silicon film. Here, a laser annealing treatment using an excimer laser (hereinafter sometimes referred to as "ELA") is carried out. That is, a pulse oscillated XeCl excimer laser light having a wavelength of 308 nm is irradiated from the surface side of the substrate 101, thereby polycrystallizing the semiconductor thin film 105. In that case, as illustrated in FIG. 1A, in a region SOM overlapping with the pattern of the light reflection and absorption layer, a polycrystal having an average grain size smaller than that in other on-glass substrate region SOI is formed. This is caused due to the matter that since a heat capacity of the light reflection and absorption layer is large and the heat is scattered thereinto, the annealing of the silicon thin film becomes insufficient in the region SOM.

Next, in the laser annealing step according to an embodiment of the invention as illustrated in FIG. 1B (this step will be hereinafter sometimes referred to as "present laser annealing step"), by irradiating a all-solid-state green laser light 107, the silicon layer of the region SOM on the pattern of the light reflection and absorption layer is selectively melted. On that occasion, a part of the polycrystalline grain in a boundary portion which is located in the region SOI but comes close to the region SOM is melted. Examples of causes thereof include (1) heat conduction in a lateral direction from the silicon layer of the melted region SOM; (2) heating due to laser light reflected diffusely in an end part of the light reflection and absorption layer; and (3) heat conduction from the end part of the light reflection and absorption layer via the insulating layer 104.

Lateral growth proceeds inwardly from the boundary defined by the pattern of the light reflection and absorption layer 103 while making a polycrystalline grain in a part of the region SOI act as a nucleus, thereby forming a more expanded polycrystalline grain in an internal region 109. In FIG. 1B, the direction to which the lateral growth proceeds is expressed by an arrow G. Incidentally, the pattern of the liquid reflection and absorption layer 103 made of a metal or the like is also heated directly upon irradiation with the laser light 107, and the heat is conducted to the heat buffer layer 102 of the base and the insulating film 104 located on an upper side thereof. The heat conducted to the insulating film 104 thermally insulates the silicon thin film during a period of the lateral growth, thereby sustaining the lateral growth over a longer period of time. As a result, there is brought an effect for prolonging a lateral growth distance (a length of a laterally grown polycrystal L).

As illustrated in FIG. 1C, since the lateral growth proceeds inwardly from the both sides of the pattern of the light reflection and absorption layer 103, a major grain boundary R of the laterally grown polycrystalline grain L is formed just in the center of the lateral growth region 109. As is clear from FIG. 1C, the size and location of the polycrystalline grain L contained in the lateral growth region 109 is geometrically controlled according to the pattern of the light reflection and absorption layer 103. By utilizing the thus uniformly controlled lateral growth region 109 for a channel region of a thin film transistor, it is possible to integrate and form a characteristically uniform thin film transistor on a substrate.

In the laser annealing step, it is preferable that the green laser pulse light 107 having a wavelength ranging from 520 nm to 540 nm is irradiated on the substrate 101. Also, in the laser annealing step, the optionally pulse oscillated laser light 107 is irradiated on the substrate 101 while being scanned within a range where the irradiation region overlaps. Also, in the light reflection and absorption layer forming step, the light reflection and absorption layer 103 is formed by using a conductive material; and in the patterning step, this conductive material is patterned and worked into, for example, a wiring containing a gate electrode of a thin film transistor. Furthermore, in the light reflection and absorption layer forming step, a high melting metal or an alloy or silicide containing a high melting metal as a component is used as the conductive material for forming the light reflection and absorption layer 103.

When the temperature is lowered due to the heat scattering after the laser irradiation, the polycrystalline grains L collide with each other in the center of the lateral growth region 109 to form the major grain boundary R. This major grain boundary R appears as a protrusion on the surface side of the polycrystalline silicon semiconductor thin film. Incidentally, in the case where the pattern width of the light reflection and absorption layer 103 is shorter than two times of a laterally growable distance (typically from 2 to 10 μm), the major grain boundary R is not formed, and before the front of the lateral growth which has proceeded inwardly from the both sides of the pattern collides, the generation of a random nucleus following a lowering of the temperature of a silicon melt occurs in the vicinity of the center in the width direction of the lateral growth region 109. In that case, a fine crystal region having a grain size of not more than 0.1 μm is formed along the center of the internal region 109 and becomes a cause to lower a TFT characteristic. Thus, it is desirable to design the pattern of the light reflection and absorption layer 103 such that a channel length of TFT is not more than two times of the lateral growth distance.

Figure 2:
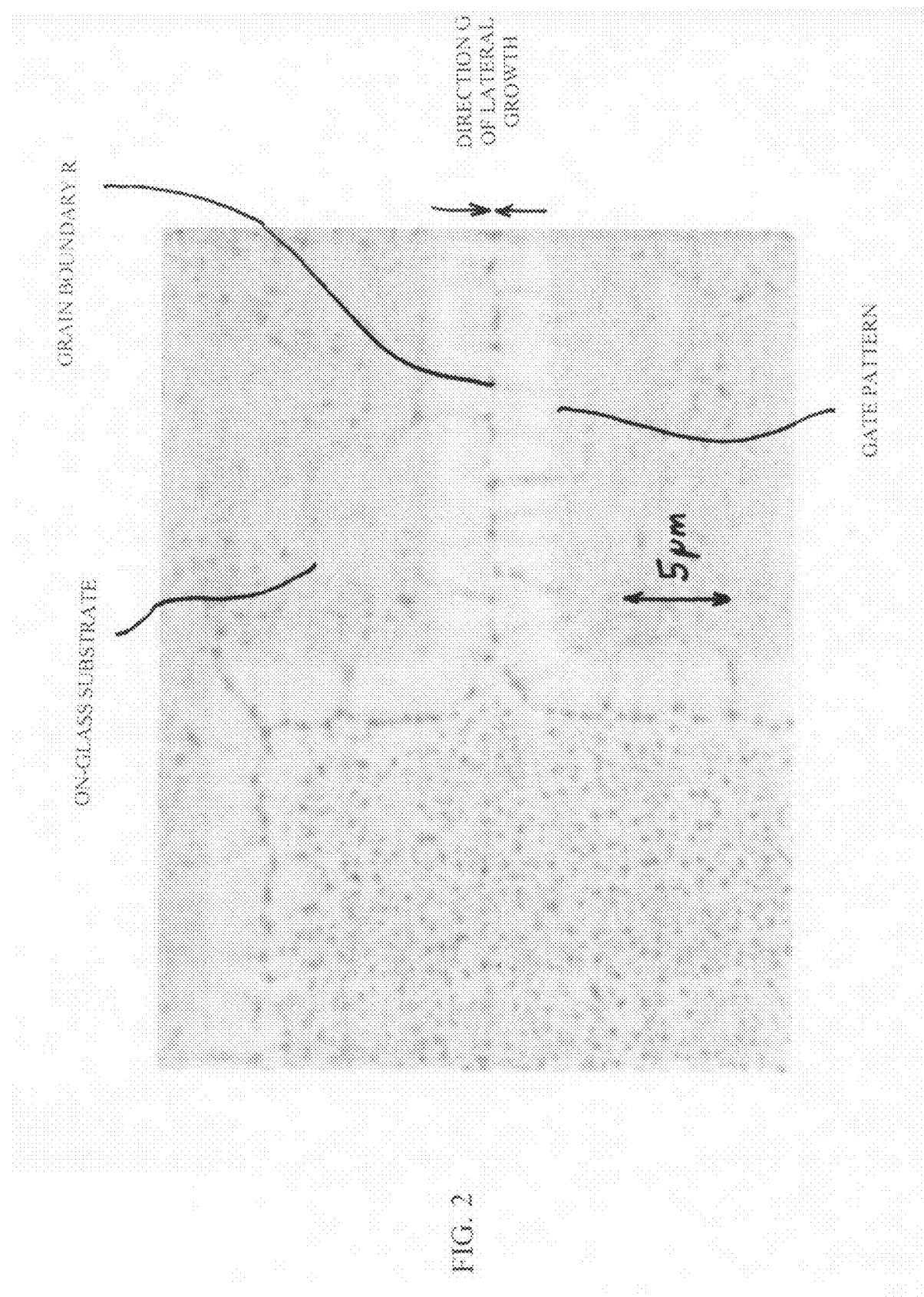
FIG. 2 is an optical microscopic photograph of a thin film semiconductor manufactured according to an embodiment of the invention.

FIG. 2 is an optical microscopic photograph of a semiconductor thin film crystallized according to an embodiment of the invention. The sample is a semiconductor thin film prepared by forming a gate electrode on a glass substrate via a heat buffer layer and further forming an amorphous silicon film thereon via a gate insulating film. After polycrystallizing this sample by ELA, the present laser annealing step is carried out. Concretely, a pulse green laser from a Q-switch Nd:YLF laser having a wavelength of 527 nm (manufactured by Coherent, Inc., U.S.A., Model: Evolution 30) is irradiated once, thereby converting polycrystalline silicon on a light absorption pattern (Mo thin film having a thickness of 60 nm) into a laterally grown polycrystal. The gate electrode is made of a high melting metal and plays a role as a light reflection and absorption layer. A pattern of the gate electrode has a width of about 6 μm. As is clear from the photograph, in an internal region overlapping with the gate electrode, polycrystalline grains formed by lateral crystal growth are arranged in good order. Though a usual grain boundary partitioning the individual polycrystalline grains from each other is parallel to the longitudinal direction of the channel region, the major grain boundary R located in the center is parallel to the width direction of the channel region. The polycrystalline grains which have grown inwardly from the both sides of the gate electrode pattern collide with each other in the center of the width direction, thereby forming the major grain boundary R. Also, in an external region of the pattern of the gate electrode, though a polycrystal formed by ELA retains as it stands, since the subject crystal grain has a fine grain size, it cannot be observed by an optical microscope.

Incidentally, in the case where a region which is required to have high-performance TFT using such a laterally grown crystal lies scattered in a specified position on a glass substrate as in, for example, a peripheral drive circuit section of a liquid crystal panel (LCD), in the present laser annealing step, by treating only a necessary region by using a short line beam instead of treating the entire surface of the substrate, the treatment time can be remarkably shortened. This configuration is shown in FIG. 3.

Figure 3:
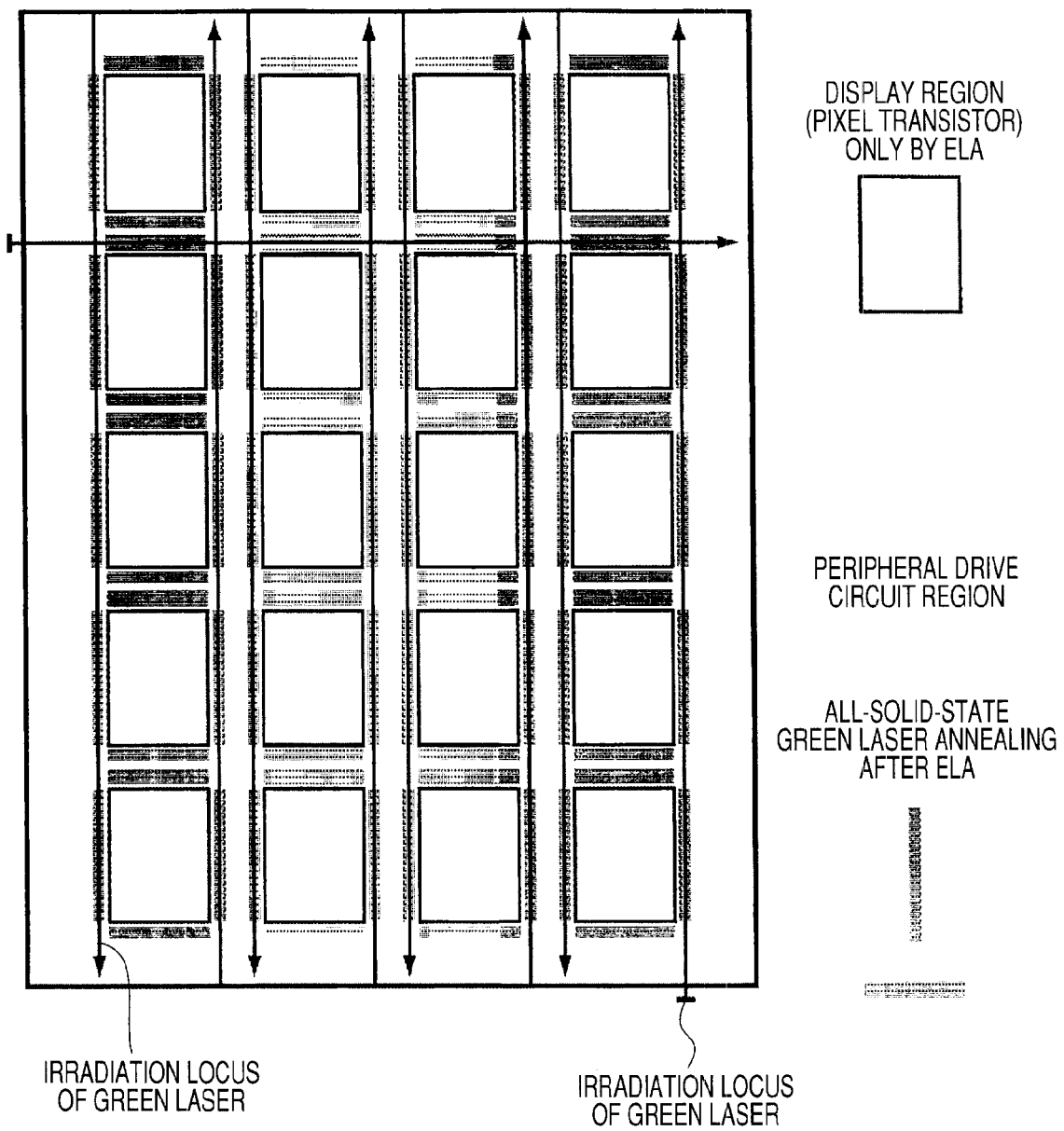
FIG. 3 schematically shows one configuration of an irradiation locus of an all-solid-state laser according to an embodiment of the invention.

An example of FIG. 3 is concerned with the case where panels of 4×5=20 are manufactured all at once from a large glass substrate. The glass substrate is separated into 20 divisions; and in each division, a display region where pixels are integrated in a matrix state and a drive circuit region surrounding it are formed. In any region, a thin film transistor is integrated and formed. In the illustrated example, in the display region, it is devised to achieve polycrystallization of a semiconductor thin film only by ELA. On the other hand, in the peripheral drive circuit region, lateral growth is caused by all-solid-state green laser annealing after ELA. The pixel transistor of the display region does not require a large drive current ability; whereas the transistor of the drive circuit region may possibly require a large drive current ability. Thus, the polycrystalline thin film which has been made large in a grain size by lateral growth is used in an active region. In the present example, overlap irradiation is carried out along with ELA and green laser annealing, and it becomes possible to realize laser irradiation with a large area in an irradiation region having a relatively small area.

In accordance with the method according to an embodiment of the invention, it becomes possible to control the size of the polycrystalline silicon grain and to control the position of the polycrystalline silicon grain boundary according to a metallic wiring pattern to be formed prior to the crystal growth such as a gate electrode, and in the case of using this in a channel region, characteristics of a thin film transistor and uniformity thereof are remarkably improved. Furthermore, even in the case where the irradiation is carried out twice (or more) instead of one-time irradiation, since the foregoing selective melting→lateral growth is merely repeated and the crystallinity and characteristics of a thin film transistor do not substantially change, the irradiation treatment can be carried out by partially overlapping the irradiation region of laser light while scanning. In that case, it is possible to uniformly crystallize a semiconductor thin film having a larger area than that of the irradiation region.

Figure 4A:
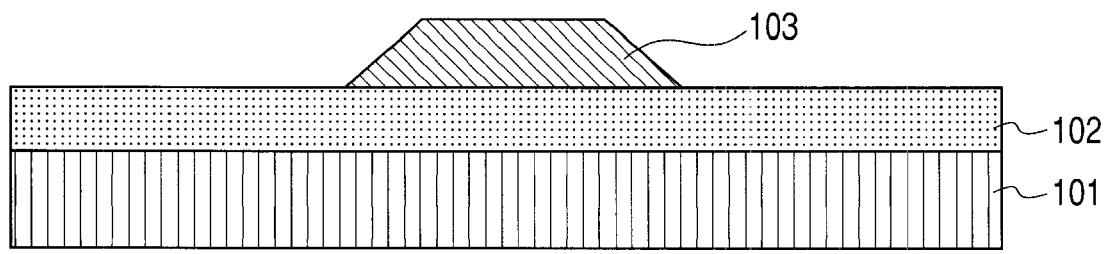
FIG. 4A to 4C are each a step drawing to show First Embodiment of a manufacturing method of a thin film semiconductor device according to an embodiment of the invention.

First Embodiment of the manufacturing method of a thin film semiconductor device according to an embodiment of the invention is described in detail with reference to FIGS. 4A to 4C and FIGS. 5D to 5E. In this First Embodiment, a thin film transistor of a bottom gate structure is formed on an insulating substrate such as a glass. First of all, as illustrated in FIG. 4A, a heat buffer layer 102 made of a two-layer structure of $SiN_x$ and $SiO_2$ is formed on a glass substrate 101; and subsequently, a metallic wiring pattern 103 including a gate electrode is formed. In the present example, $SiN_x$ and $SiO_2$ were formed in a thickness of 100 nm and 200 nm, respectively by a plasma CVD method, thereby providing the heat buffer layer 102. Thereafter, a molybdenum thin film was formed in a thickness of 60 nm by employing a magnetron sputtering method, and the metallic wiring pattern 103 having a width ranging from 2 to 20 μm was then formed by photolithography and reactive ion etching. Incidentally, besides molybdenum, a high melting metal such as Ti, W, and Ta or an alloy or silicide thereof can be used for the metallic wiring pattern including a gate electrode.

Figure 4B:
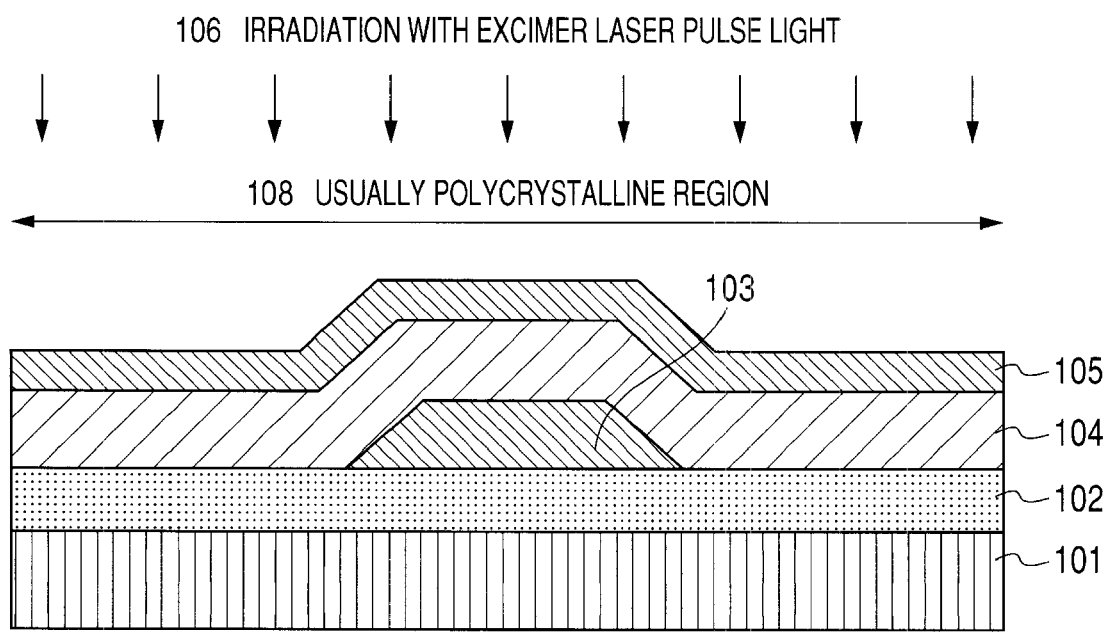

Next, as illustrated in FIG. 4B, as a gate insulating film 104, $SiN_x$ and $SiO_2$ were formed in a thickness of from 25 to 50 nm and from 30 to 50 nm, respectively by a plasma CVD method; and subsequently, a semiconductor thin film 105 made of amorphous silicon was formed in a thickness of from about 30 to 60 nm by a plasma CVD method only by switching the raw material gas. Thereafter, a so-called dehydrogenation annealing treatment of performing a heat treatment in a nitrogen atmosphere in a furnace at a temperature of 400° C. for from about 1 to 3 hours, thereby reducing the hydrogen amount in the amorphous silicon thin film 105 to from about 0.1 to 2 [atomic %] was carried out. Incidentally, when a fabrication method in which the hydrogen amount is substantially low in the film, such as a sputtering method and an LP-CVD method, is employed, this dehydrogenation annealing treatment is not necessary. Furthermore, instead of the annealing in a furnace, it is also possible to employ a so-called laser dehydrogenation treatment in which the silicon thin film is heated by irradiating laser light at a relatively low energy density to such degree that the silicon thin film is not completely melted.

Also, as illustrated in FIG. 4B, the Si layer was polycrystallized by usual excimer laser annealing (ELA) by using an XeCl excimer laser having a wavelength of 308 nm. With respect to the irradiation condition, the irradiation was carried out under an overlap condition of from about 90 to 98% at an optimum energy density of from 300 to 450 mJ/cm² such that the average grain size on the glass was from about 0.1 to 5 μm.

Figure 4C:
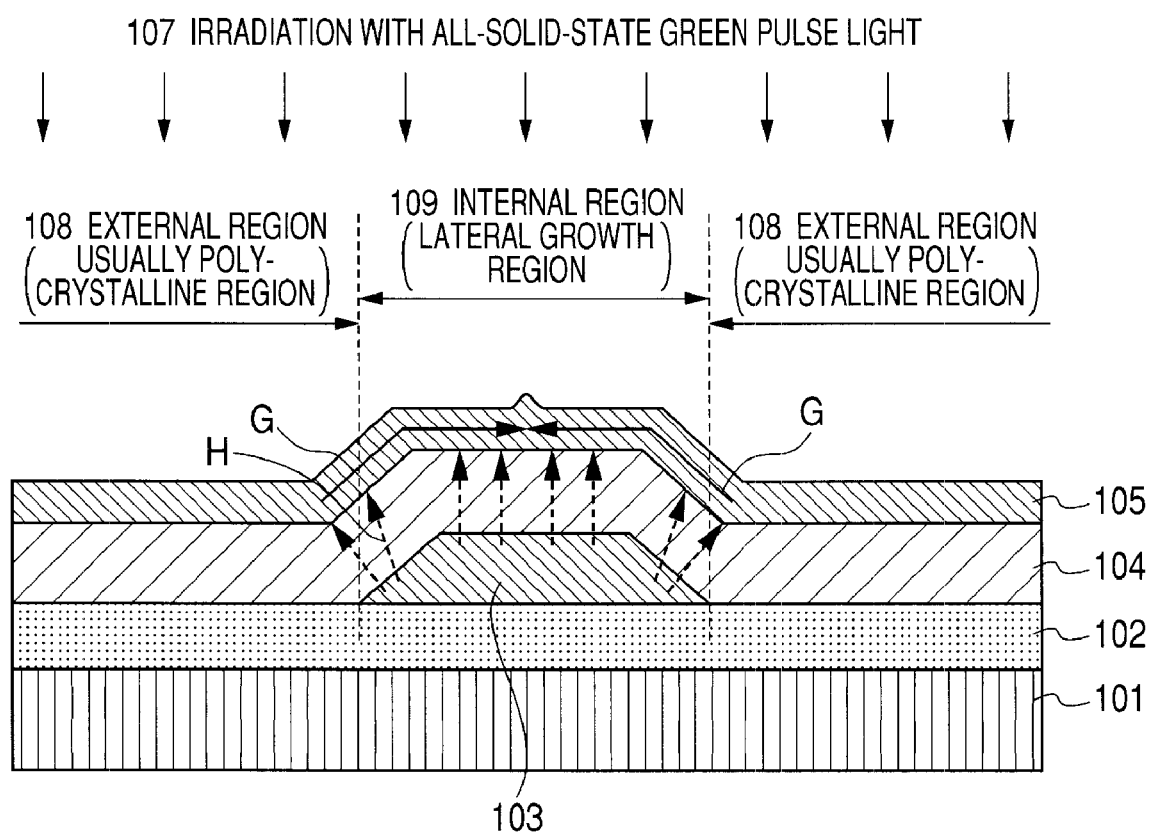

Next, as illustrated in FIG. 4C, laser light 107 of a second harmonic wave output pulse oscillated from a solid laser is irradiated via an appropriate irradiation optical system. As the solid laser, a second harmonic wave output of a pulse oscillated Q-switch Nd:YAG laser or Nd:YLF laser can be used. The wavelength of such a second harmonic wave output is 532 nm and 527 nm in this order. Though both laser diode excitation and lamp excitation by an arc lamp or a flash lamp or the like are similarly employable, laser diode excitation is preferable from the viewpoints of output stability and an exchange cycle of an excitation light source, and for example, Evolution Series (oscillation wavelength: 527 nm) of Coherent, Inc., U.S.A and CORONA Series (oscillation wavelength: 532 nm) of the same company can be used. In the present embodiment, Evolution 30 of Coherent, Inc., U.S.A was used, and the oscillation condition of a repeating frequency of 1 kHz, a pulse width of about 150 ns and pulse energy of 20 mJ was employed. As the irradiation optical system, a linear beam formed by unifying a light intensity distribution within an irradiation spot to not more than ±5% by a unified optical system composed of a condenser lens, a fly's eye lens and the like and then shaping so as to have a length of 3 mm and a width of 0.2 mm by a shaping optical system composed of a cylindrical lens, a slit and a condenser lens was used. An energy density was regulated within a range of from 500 to 900 mJ/cm². By scanning this linear beam in a width direction, it is possible to crystallize a semiconductor thin film with a large area.

By this laser light irradiation, a portion of the semiconductor thin film 105 located just above the gate electrode pattern 103 becomes a lateral growth region 109. As described previously, the growth direction of the lateral growth region 109 is expressed by an arrow G. A conduction direction of a heat from the gate electrode pattern 103 which is effective for prolonging the growth time of this lateral growth is expressed by an arrow H.

Figure 5A:
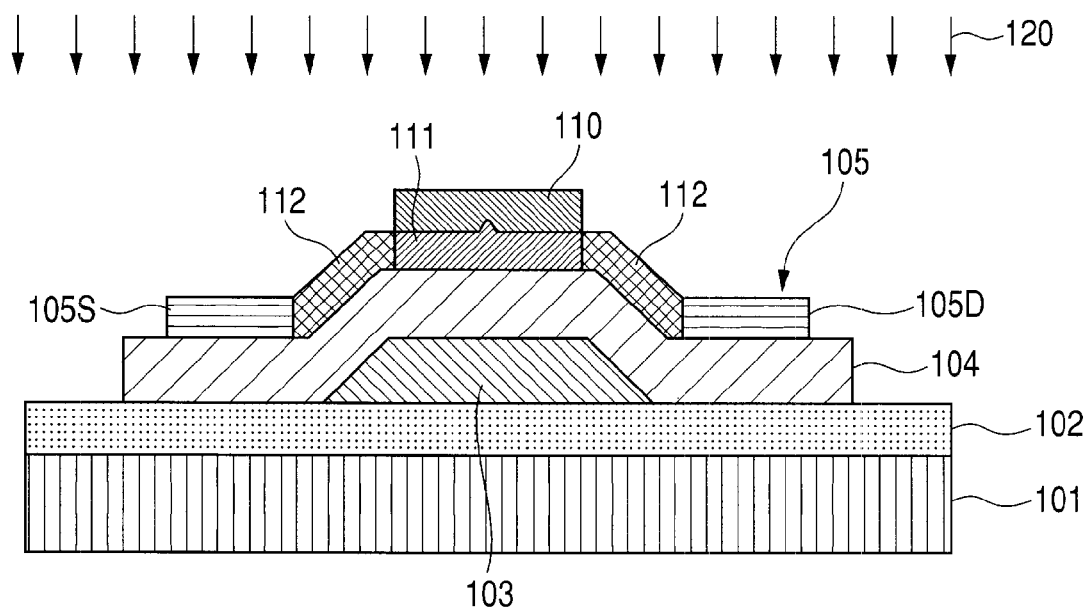
FIGS. 5A to 5B are each a step in a manufacturing method of a thin film semiconductor device according to an embodiment of the invention.
Figure 5B:
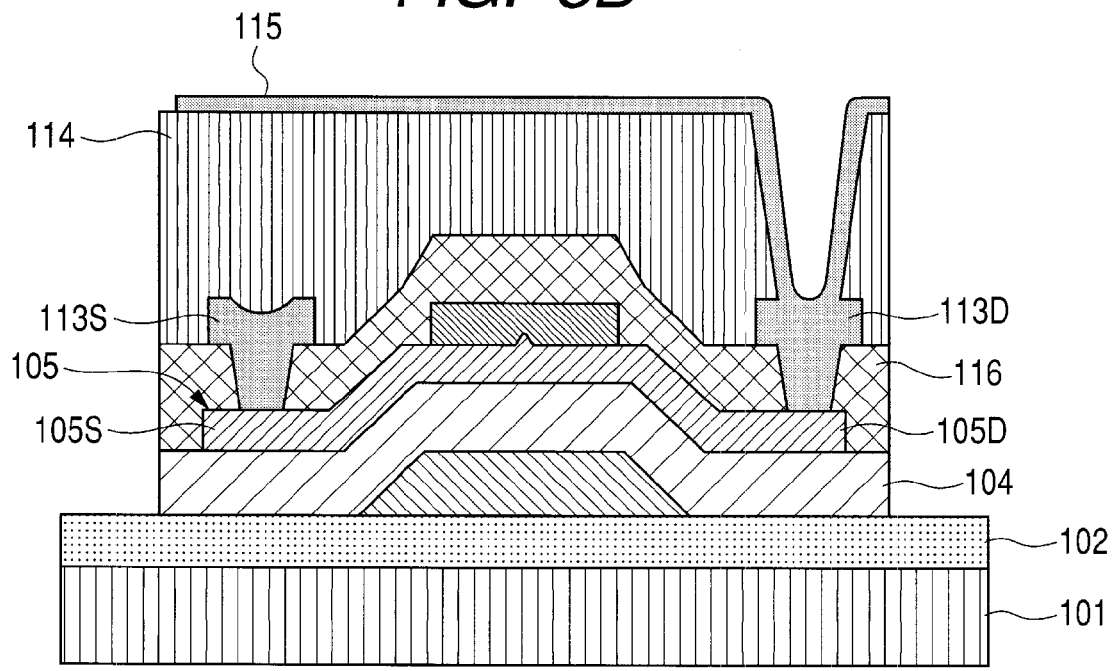

Subsequently, as illustrated in FIG. 5D, for the purpose of controlling a threshold voltage Vth of the thin film transistor, Vth ion implantation is applied to the poly-crystallized semiconductor thin film 105 as the need arises. Here, for example, a $B^+$ ion is injected in a dose amount of approximately $5 \times 10^{11}$ to $4 \times 10^{12}/cm^2$ at an accelerating energy of 10 keV.

Subsequently, the gate electrode 103 is aligned on the semiconductor thin film 105 crystallized in the preceding step to form an insulating stopper film 110. On that occasion, first of all, an $SiO_2$ film is formed in a thickness of from about 100 nm to 300 nm by a plasma CVD method. Here, a silane gas, $SiH_4$ and a nitrous oxide gas, $N_2O$ are plasma decomposed to accumulate an $SiO_2$ film. Next, this $SiO_2$ film is patterned into a prescribed shape, thereby working it into the stopper film 110. In that case, the stopper film 110 is patterned such that it causes self-alignment with the gate electrode 103. Incidentally, a portion of the semiconductor thin film 105 located just beneath the stopper film 110 is passivated as a channel region 111. In this channel region 111, a $B^+$ ion is injected in advance in a relatively low dose amount by Vth ion implantation as described previously.

Subsequently, impurities ($P^+$ ion) are injected into the semiconductor thin film 105 by ion doping 120 by using the stopper film 110 as a mask, thereby forming an LDD region 112. At that time, the dose amount is, for example, from $5 \times 10^{12}$ to $1 \times 10^{13}/cm^2$; and the accelerating voltage is, for example, 10 keV. Furthermore, a photoresist (not illustrated) is pattern formed so as to cover the stopper film 110 and the LDD region 112 on each of the both sides thereof; the impurities 120 (for example, $P^+$ ion) are injected in a high concentration into the semiconductor thin film 105 by using this photoresist as a mask, thereby forming a source region 105S and a drain region 105D. For the injection of impurities, for example, the ion doping 120 (ion shower) can be used. This is made for the purpose of injecting impurities by electric field acceleration without applying mass separation, and the impurities are injected in a dose amount of, for example, approximately $1 \times 10^{15}/cm^2$, thereby forming the source region 105S and the drain region 105D. The accelerating voltage is, for example, 10 keV.

Thereafter, the impurities injected into the semi-conductor thin film 105 are inactivated by RTA (rapid thermal annealing) using an ultraviolet light lamp. Unnecessary portions of the semiconductor thin film 105 and the gate insulating film 104 are then simultaneously patterned, thereby not only forming a thin film transistor of a bottom gate type but separating this thin film transistor for every element.

Thereafter, as illustrated in FIG. 5E, $SiO_2$ and $SiN_x$ are continuously fabricated in a thickness of from about 100 nm to 200 nm and from about 200 nm to 400 nm, respectively by plasma CVD so as to cover the thin film transistor on the substrate 101, thereby forming an inter-layer insulating film 116. At this stage, hydrogenation annealing for performing a heat treatment at from approximately 350° C. to 400° C. for one hour in a nitrogen gas or foaming gas atmosphere or in vacuo, thereby diffusing a hydrogen atom contained in the inter-layer insulating film 116 into the semiconductor thin film 105 was carried out. Thereafter, a contact hole is opened in the inter-layer insulating film 116, and Mo, Al, etc. is sputtered in a thickness of from 100 nm to 1 µm, followed by patterning into a prescribed shape to form a source electrode 113S and a drain electrode 113D connected to the source region 105S and the drain region 105D, respectively. Furthermore, a flattened layer 114 made of a photosensitive acrylic resin or the like is coated in a thickness of from approximately 1 to 3 µm, and a contact hole reaching the drain electrode 113D is then opened by photolithography. Then, a transparent conductive film made of indium tin oxide ($In_2O_3+SnO_2$, hereinafter referred to as "ITO") or the like, or a reflection electrode film made of Ag, Al, or the like is sputtered on the flattened layer 114, followed by patterning into a prescribed shape to form a pixel electrode 115 connected to the drain electrode 113D. Incidentally, with respect to a transistor of the drive circuit section, the pixel electrode 115 is not formed.

A thin film semiconductor device having a thin film transistor on the insulating substrate 101 is thus accomplished. As described previously, in this thin film transistor, the semiconductor thin film 105 and the gate electrode 103 are stacked while interposing the gate insulating film 104 therebetween. The semiconductor thin film 105 has the channel region 111 overlaid on the gate electrode 103 and the source region 105S and the drain region 105D located on the both sides of the channel region 111. The semiconductor thin film 105 is a polycrystalline layer crystallized by laser annealing and is separated into an internal region and an external region along a boundary of a prescribed pattern (see FIG. 4C). The external region is a polycrystalline region 108 formed by excimer laser annealing (ELA). The internal region has a lateral growth region 109 containing a polycrystalline grain laterally grown inwardly from a pattern boundary while making the polycrystalline grain contained in the polycrystalline region 108 act as a nucleus by laser annealing for irradiating a all-solid-state green laser light 107. Here, the channel region 111 of the thin film transistor (see FIG. 5D) is formed in the lateral growth region 109 (see FIG. 4C).

In addition thereto, the thin film transistor is provided with the LLD region 112 having an impurities concentration lower than the drain region 105D between the channel region 111 and at least the drain region 105D. This LLD region 112 is formed in the polycrystalline region 108 or the lateral growth region 109. Incidentally, though this LLD region 112 is provided for the purpose of increasing a withstand pressure of an N channel type transistor, in the case where the withstand pressure is not required, the LLD region 112 can be omitted.

Typical process parameters of the laser annealing work according to an embodiment of the invention are enumerated below.

(1) A gate pattern with Mo is formed on a glass substrate.
(2) Three layers of $SiN_x$, $SiO_2$ and a-Si are continuously fabricated in this order by plasma CVD.
(3) The Si layer is polycrystallized by usual excimer laser annealing (ELA) (first laser annealing step).
   The overlap condition is from approximately 90 to 98%.
   A laser is irradiated at an optimum energy density such that the average grain size is from approximately 0.1 to 5 µm on the glass.
   In that case, the irradiation energy density ($mJ/cm^2$) is insufficient on the Mo gate pattern; and the average grain size is smaller than from 0.1 to 5 µm.
(4) A green all-solid-state laser is irradiated at an overlap of from approximately 0 to 90%, thereby achieving lateral growth only on the Mo gate pattern (second laser annealing step).
   On the glass, since the irradiation energy density of the all-solid-state laser is insufficient, a polycrystal formed by ELA retains as it stands.

Figure 6:
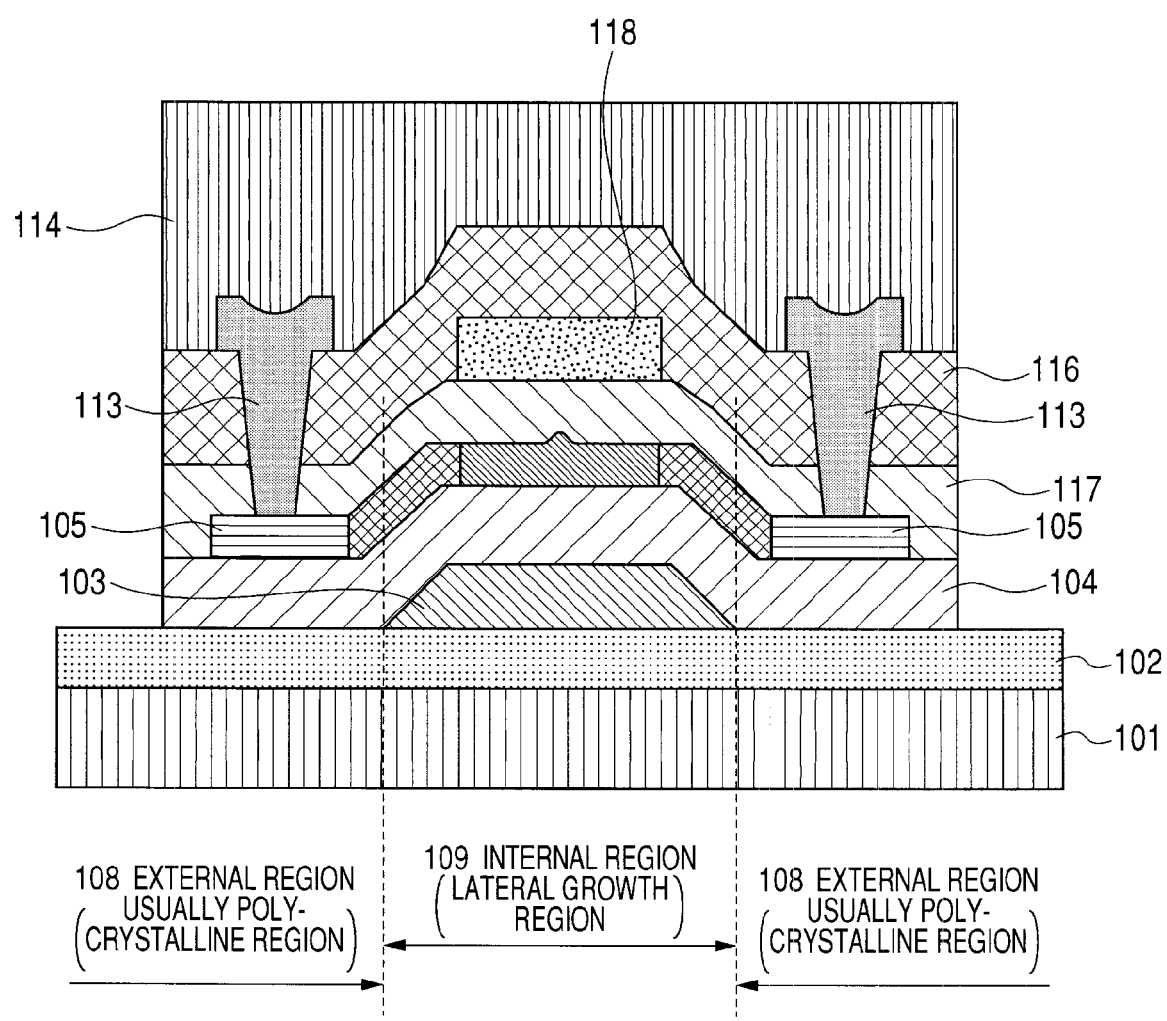
FIG. 6 is a cross-sectional structural view to show Second Embodiment of a thin film semiconductor device according to an embodiment of the invention.

FIG. 6 shows Second Embodiment of a manufacturing method of a thin film semiconductor device according to an embodiment of the invention. A point of difference from the structure of the thin film transistor of the First Embodiment (see FIG. 5E) resides in a point that after achieving lateral growth in an on-gate pattern region by all-solid-state laser annealing, an $SiO_2$ thin film is fabricated in a thickness of 70 nm by plasma CVD to form a second gate insulating film 117 and that a second gate electrode 118 is formed in the same manner as in the first gate electrode 103. While illustration is omitted in FIG. 6, the first gate electrode 103 and the second gate electrode 118 are connected to each other by an aluminum electrode via a contact hole penetrating through the first gate insulating film 104 and the second gate insulating film 117 so as to have the same potential. According to such a dual gate structure, it is possible to obtain a higher ON-state current and a more uniform transistor characteristic as compared with the thin film transistor of the First Embodiment.

Figure 7:
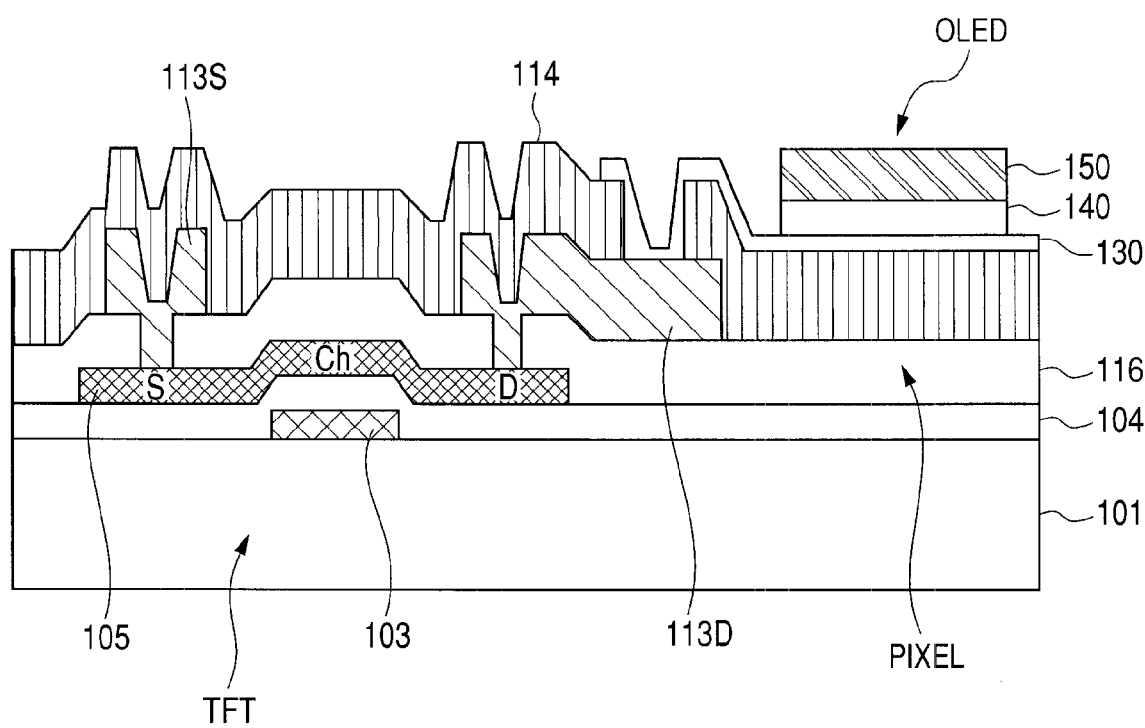
FIG. 7 is a schematic cross-sectional view to show one example of a display according to an embodiment of the invention.

FIG. 7 is a schematic cross-sectional view to show one example of a display according to an embodiment of the invention. For the purpose of making the illustration easy, only one pixel and one thin film transistor TFT for driving it are illustrated. Pixels are arranged in a matrix state to configure an image plane. In the present example, this pixel is composed of an organic EL electroluminescence device OLED and resulted from stacking a transparent electrode 130, an organic EL layer 140 and a metal electrode 150 in this order. The transparent electrode 130 is separated for every pixel and functions as an anode A of OLED and is composed of a transparent conductive film made of, for example, ITO. The metal electrode 150 is commonly connected between pixels and functions as a cathode K of OLED. The organic EL layer 140 is a composite film resulting from stacking, for example, a hole transport layer and an electron transport layer. For example, Diamyle is vapor deposited as a hole transport layer on the transparent electrode 130 functioning as the anode A (hole injection electrode); Alq3 is vapor deposited as an electron transport layer thereon; and the metal electrode 150 functioning as the cathode K (electron injection electrode) is further formed thereon. Incidentally, Alq3 represents 8-hydroxyquinoline aluminum. OLED having such a stack structure is merely one example. When a voltage is applied between the anode and the cathode of OLED having such a configuration in a forward direction, the injection of carriers such as an electron and a hole takes place, whereby light emission is observed. It is thought that the motion of OLED is light emission by an exciton formed by a hole injected from the hole transport layer and an electron injected from the electron transport layer.

On the other hand, TFT is one prepared according to an embodiment of the invention and is composed of the gate electrode 103 formed on the substrate 101 made of a glass or the like, the gate insulating film 104 overlaid thereon, and the semiconductor thin film 105 overlaid in an upper part of the gate electrode 103 via the gate insulating film 104. This semiconductor thin film 105 is composed of a polycrystalline silicon thin film laterally grown according to an embodiment of the invention. The thin film transistor TFT is provided with a source S, a channel Ch and a drain D as a pathway of a current to be fed into OLED. The channel Ch is located just above the gate electrode 103. This TFT having a bottom gate structure is covered by the inter-layer insulating film 116, on which are formed the source electrode 113S and the drain electrode 113D. The foregoing OLED is fabricated on these electrodes via the other inter-layer insulating film 114. A contact hole is opened in the inter-layer insulating film 114, and the transparent electrode 130 of OLED is electrically connected to the drain electrode 113D of TFT via this contact hole. Incidentally, in the present example, the pixel is configured of an organoelectroluminescence device OLED, but it should not be construed that an embodiment of the invention is limited thereto. For example, the pixel can be configured to include a pixel electrode connected to a thin film transistor TFT, a counter electrode opposing thereto and a liquid crystal held therebetween.

In the foregoing manufacturing method of a semiconductor device according to an embodiment of the invention, in the semiconductor thin film forming step which is a preceding step of the present laser annealing step, during the formation of a polycrystalline thin film containing a polycrystalline grain of silicon or composed of silicon as a major component, the crystallization was carried out by using ELA. That is, a semiconductor thin film made of silicon or composed of silicon as a major component was fabricated on a substrate by a vapor phase epitaxy method (CVD) and then converted into a polycrystalline thin film upon irradiation with laser light having a wavelength of an ultraviolet region. However, it should not be construed that an embodiment of the invention is limited thereto, but the polycrystallization may be achieved by laser annealing using a green laser in place of ELA likewise the present laser annealing step. That is, in the semiconductor thin film forming step, a semiconductor thin film made of silicon or composed of silicon as a major component may be fabricated on a substrate by a vapor phase epitaxy method and then converted into a polycrystalline thin film upon irradiation with laser light having a wavelength of a visible light region. In other words, the laser annealing step is separated into two steps and carried out by changing the irradiation condition. A CVD fabricated semiconductor thin film is polycrystallized upon irradiation with a green laser in a first step; and lateral growth is selectively caused upon irradiation with a green laser in a second step.

In all of these two steps, the irradiation condition of the case of carrying out green laser annealing is, for example, as follows.

[Condition of the First Step]
Irradiation energy density: from approximately 500 to 600 mJ/cm$^2$
Overlap: from 75 to 95% (namely, irradiating the same place 4 to 20 times)
Polycrystalline silicon having an average grain size of from 0.1 to 0.5 μm is formed by this irradiation.

[Condition of the Second Step]
Irradiation energy density: from approximately 750 to 900 mJ/cm$^2$
Overlap: from 0 to 75% (namely, irradiating the same place 1 to 4 times)

Figure 8:
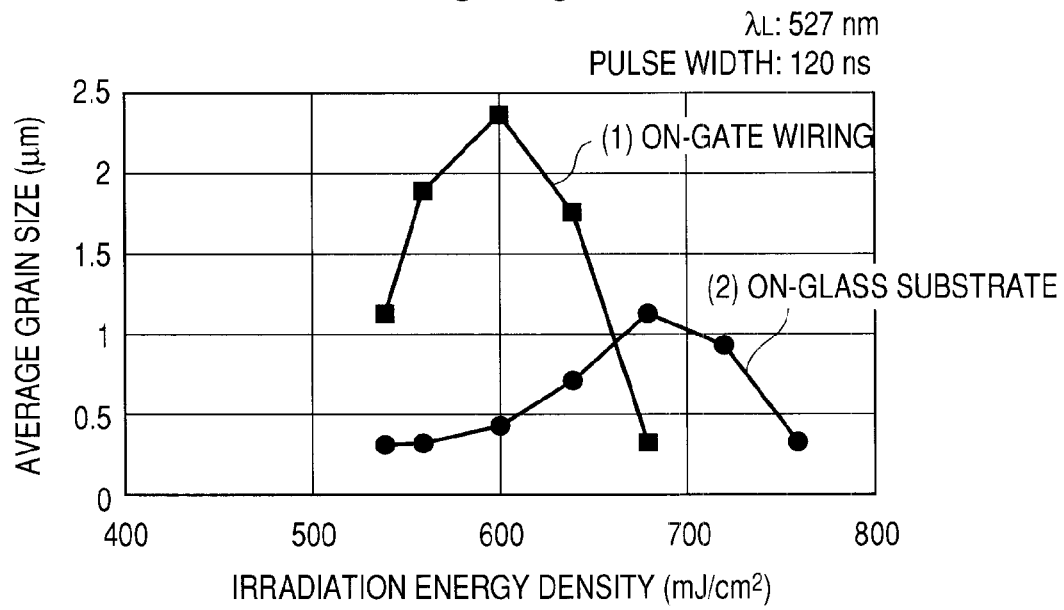
FIG. 8 is a graph to explain a modification example of a manufacturing method of a thin film semiconductor device according to an embodiment of the invention.
Figure 9:
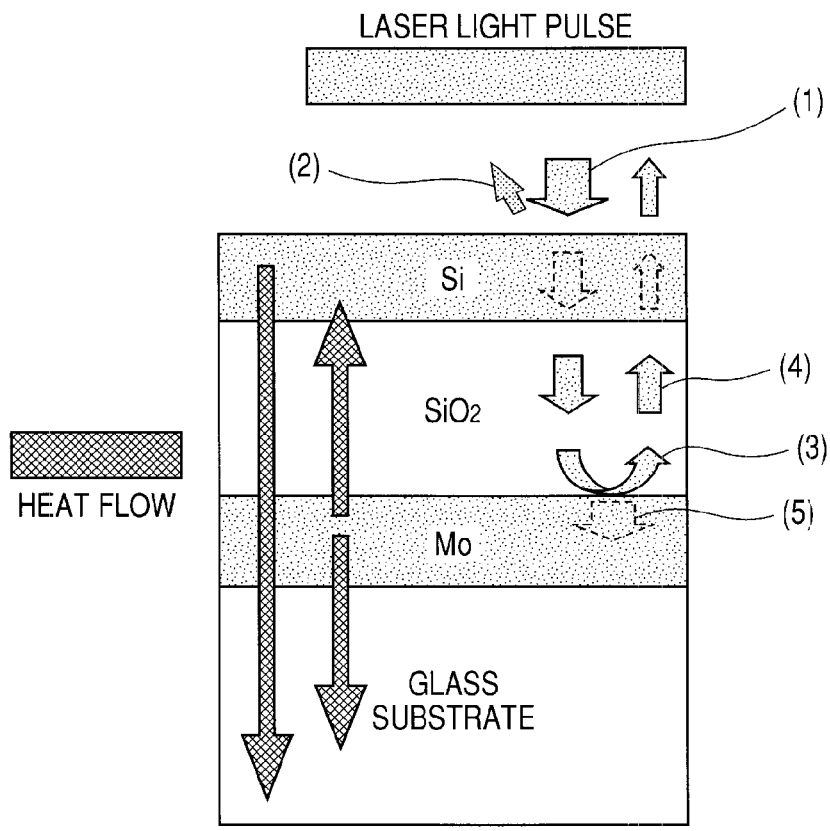
FIG. 9 is a schematic view to be provided for explaining a manufacturing method of a thin film semiconductor device according to an embodiment of the invention.

The irradiation energy density in the first step is set up lower than that in the second step. Reasons for this are explained with reference to FIG. 8. FIG. 8 shows an average grain size of a semiconductor thin film made of silicon crystallized upon irradiation with a green laser in terms of a function of irradiation energy density. However, in obtaining a graph of FIG. 8, a sample prepared by forming a gate wiring made of molybdenum (Mo) having a thickness of 90 nm on a glass substrate, fabricating an SiO$_2$ film having a thickness of 150 nm by a plasma CVD method and further fabricating a semiconductor thin film made of amorphous silicon and having a thickness of 50 nm by a plasma CVD method was used. Then, as a crystallization step of the semiconductor thin film in this sample, pulse light from a laser diode excited Nd:YLF laser having a wavelength of 527 nm and a pulse width of 120 ns (namely, all-solid-state laser) was irradiated 12.5 times for every sample in an overlap ratio of 92%, namely in the same place at an energy density expressed on the abscissa. Incidentally, the pulse waveform is a Gaussian distribution, and its half-value width is defined as a pulse width.

In the laser annealing using a green laser light, as described previously, laser light is made incident on the gate wiring, and the gate wiring is heated directly by irradiation with the laser light but not by heat conduction from the semiconductor thin film. For that reason, in contrast to the related-art crystallization a principal object of which is to heat a semiconductor thin film, the crystal grain size becomes larger at a relatively low irradiation energy density in the on-gate wiring (1) than in the on-glass substrate (2) (namely, a portion where no gate wiring is present). Incidentally, what the laser light reflected on the surface of the gate wiring is again made incident on the semiconductor thin film layer and partially absorbed becomes a cause of the matter that the optimum irradiation energy is lower in the on-gate wiring (1) than in the on-glass substrate (2).

In the semiconductor thin film forming step, not only the foregoing formation of a polycrystalline thin film by utilizing laser annealing but the formation of a polycrystalline thin film made of silicon or composed of silicon as a major component directly on a substrate by chemical vapor deposition such as reactive heat CVD and plasma CVD may be employed. This embodiment is hereunder described.

In the present embodiment, in a manufacturing step of a thin film field effect transistor (TFT) which is a semiconductor device using a glass substrate or the like, for the purpose of forming a polycrystalline semiconductor thin film capable of realizing TFT with a high-performance device characteristic, namely a high mobility, a polycrystalline semiconductor thin film is formed in advance on a substrate, and the subject thin film is annealed by green laser, thereby obtaining a polycrystalline semiconductor thin film with high quality by a small number of times of laser annealing.

More concretely, as a method of forming a polycrystalline semiconductor thin film in advance prior to the laser annealing, the following reactive heat CVD method is employed. First of all, by utilizing a redox reaction between $Si_2H_6$ and $GeF_4$ and etching properties of $GeF_4$, a polycrystalline semiconductor thin film is grown at a relatively low temperature of 450° C. by using He as a carrier gas. At that time, a flow amount ratio of $Si_2H_6$ to $GeF_4$ to He of 2.5/0.1/500 was used in the present embodiment. The flow amount ratio is preferably in the range of (2.0 to 2.5)/(0.08 to 0.13)/(450 to 500).

By separating the growth process of the thin film into two stages including a stage of generating a crystal nucleus at the initial stage of fabrication and a stage of selectively growing the generated crystal nucleus to form a continuous film, a polycrystalline semiconductor thin film in which a grain size of from the substrate surface to the thin film surface is uniform and the grain size itself is controlled at a size of from 0.1 to 0.2 μm is formed.

By regulating a fabrication pressure at this nucleus generation stage at not more than 0.45 Torr, a plane azimuth of the crystal nucleus becomes (111) preferential orientation, and a plane azimuth of the final polycrystalline semiconductor thin film becomes (111) preferential orientation. Accordingly, a polycrystalline semiconductor thin film with a small surface roughness is formed.

When green laser annealing is performed by using this polycrystalline semiconductor thin film, secondary crystal growth proceeds in a lateral direction, and a grain having a large grain size after the laser annealing is obtainable.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a thin film semiconductor device comprising the steps of:
    forming a light reflection and absorption layer for reflecting and absorbing light on a substrate;
    patterning the light reflection and absorption layer in a prescribed shape;
    forming an insulating film covering the patterned light reflection and absorption layer;
    forming a semiconductor thin film containing a polycrystalline grain on the insulating film; and
    laser annealing the entire surface of the semiconductor thin film by irradiating a pulse oscillated laser light to crystallize the semiconductor thin film, wherein an external region of the semiconductor thin film located outside the pattern of the light reflection and absorption layer is not melted by the laser annealing and an internal region of the semiconductor thin film located inside the pattern of the light reflection and absorption layer is melted by the laser annealing, and
    after the internal region has been melted, lateral growth proceeds inwardly from a boundary between the external region and the internal region while making a polycrystalline grain in the external region act as a nucleus.

2. The method of manufacturing a thin film semiconductor device according to claim 1, wherein
    the semiconductor thin film formed in the semiconductor thin film forming is a polycrystalline thin film containing a polycrystalline grain of silicon or composed of silicon as a major component.

3. The method of manufacturing a thin film semiconductor device according to claim 2, wherein
    in the semiconductor thin film forming step, after fabricating a semiconductor thin film of silicon or composed of silicon as a major component on the substrate by a vapor phase epitaxy method, laser light having a wavelength of an ultraviolet region is irradiated to convert the semiconductor thin film into a polycrystalline thin film.

4. The method of manufacturing a thin film semiconductor device according to claim 2, wherein
    in the semiconductor thin film forming step, after fabricating the semiconductor thin film of silicon or composed of silicon as a major component on the substrate by a vapor phase epitaxy method, laser light having a wavelength of a visible light region is irradiated to convert the semiconductor thin film into a polycrystalline thin film.

5. The method of manufacturing a thin film semiconductor device according to claim 2, wherein
    in the semiconductor thin film forming step, a polycrystalline thin film of silicon or composed of silicon as a major component is formed directly on the substrate by chemical vapor deposition.

6. The method of manufacturing a thin film semiconductor device according to claim 1, wherein
    in the laser annealing step, laser light having a wavelength ranging from 520 nm to 540 nm is irradiated on the substrate.

7. The method of manufacturing a thin film semiconductor device according to claim 1, wherein
    in the laser annealing step, pulse oscillated laser light is irradiated on the substrate while scanning within a range where the irradiation region overlaps.

8. The method of manufacturing a thin film semiconductor device according to claim 1, wherein
    in the light reflection and absorption layer forming step, the light reflection and absorption layer is formed using a conductive material; and
    in the patterning step, the conductive material is patterned to work into a wiring containing a gate electrode.

9. The method of manufacturing a thin film semiconductor device according to claim 8, wherein
    in the light reflection and absorption layer forming step, a high melting metal or an alloy or silicide containing a high melting metal as a component is used as the conductive material for forming the light reflection and absorption layer.

* * * * *

UNITED STATES PATENT AND TRADEMARK OFFICE
CERTIFICATE OF CORRECTION

PATENT NO. : 7,790,521 B2  Page 1 of 1
APPLICATION NO. : 11/753751
DATED : September 7, 2010
INVENTOR(S) : Akihiko Asano It is certified that error appears in the above-identified patent and that said Letters Patent is hereby corrected as shown below:

On the Title page item Inventor: "Akihiko Asano, Knagawa (JP)"

should be

(75) Inventor: --Akihiko Asano, Kanagawa (JP)--

Signed and Sealed this

Twenty-third Day of November, 2010

David J. Kappos
*Director of the United States Patent and Trademark Office*